United States Patent
Moon

(10) Patent No.: US 11,408,930 B2
(45) Date of Patent: Aug. 9, 2022

(54) SEMICONDUCTOR DEVICE AND OPERATION METHOD OF THE SEMICONDUCTOR DEVICE

(71) Applicant: SK hynix Inc., Icheon-si (KR)

(72) Inventor: Young Jin Moon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/148,075

(22) Filed: Jan. 13, 2021

(65) Prior Publication Data
US 2022/0003813 A1    Jan. 6, 2022

(30) Foreign Application Priority Data
Jul. 1, 2020 (KR) .................. 10-2020-0080790

(51) Int. Cl.
*G01R 31/28*    (2006.01)
(52) U.S. Cl.
CPC ..... *G01R 31/2856* (2013.01); *G01R 31/2879* (2013.01)

(58) Field of Classification Search
CPC ............ G01R 33/0047; H01L 33/48; H01L 2933/0033
See application file for complete search history.

(56) References Cited

U.S. PATENT DOCUMENTS

| | | | |
|---|---|---|---|
| 8,310,265 B2 | 11/2012 | Zjajo et al. | |
| 9,353,017 B2 | 5/2016 | Krishna et al. | |
| 2012/0133345 A1* | 5/2012 | Tai | G05F 1/00 323/282 |
| 2013/0088375 A1* | 4/2013 | Wu | H03M 1/1047 341/120 |

* cited by examiner

*Primary Examiner* — Tung X Nguyen
(74) *Attorney, Agent, or Firm* — William Park & Associates Ltd.

(57) ABSTRACT

A semiconductor device includes a voltage comparison circuit and a calibration control circuit. The voltage comparison circuit compares test reference voltages and generates a comparison result signal. The calibration control circuit controls an offset value of the voltage comparison circuit.

11 Claims, 6 Drawing Sheets

(A)

(B)

SEMICONDUCTOR DEVICE AND OPERATION METHOD OF THE SEMICONDUCTOR DEVICE

CROSS-REFERENCES TO RELATED APPLICATION

The present application claims priority under 35 U.S.C. § 119(a) to Korean application number 10-2020-0080790, filed on Jul. 1, 2020, in the Korean Intellectual Property Office, which is incorporated herein by reference in its entirety.

BACKGROUND

1. Technical Field

Various embodiments generally relate to a semiconductor device and an operating method of the semiconductor device, and more particularly, to a semiconductor device capable of a built-in self test and an operating method of the semiconductor device.

2. Related Art

In general, semiconductor devices are subjected to various test operations prior to their release on the market. The semiconductor devices may have a more stable and accurate operation guaranteed through test operations. Existing test operations use automatic test equipment (ATE). However, as semiconductor devices evolve over time to perform more complicated operations, the number of tests that must be performed by the ATE gradually becomes huge. If the number of tests is huge, this means that the time during which the test equipment is used is increased. If the time during which the test equipment is used is increased, this means that a unit price for the semiconductor devices is increased.

As a scheme for solving such a problem, there is interest in a built-in self test circuits. A built-in self test circuit may be installed within a semiconductor device, and may perform some test operations in place of the ATE. Accordingly, if the built-in self test circuit is used, a unit price for the semiconductor device can be reduced because the time during which the test equipment is used can be reduced.

In general, the configuration of a built-in self test circuit is complicated, and an area occupied by the circuit is large. If the configuration of the circuit is complicated, this means that an error may occur in a test result value due to an influence attributable to noise. Furthermore, if the area occupied by the circuit is large, complications arise in installing the built-in self test circuit within the semiconductor device from a design viewpoint.

SUMMARY

Various embodiments are directed to a semiconductor device capable of controlling an offset value of a voltage comparison circuit through a minimum or reduced configuration.

Also, various embodiments are directed to a semiconductor device for which an internal voltage can be set and reset through a calibration operation and setup operation performed upon a test operation and an operating method of the semiconductor device.

Objects of the present disclosure are not limited to the aforementioned objects, and other objects not described above may be evidently understood by those skilled in the art, to which the present disclosure pertains, from the following description.

In an embodiment, a semiconductor device may include a voltage comparison circuit suitable for generating a comparison result signal by comparing test reference voltages received through a first input stage and a second input stage, respectively. The semiconductor device may also include a calibration control circuit suitable for generating a calibration code for controlling an offset value of the voltage comparison circuit upon a calibration operation and providing the calibration code to the voltage comparison circuit.

In an embodiment, an operating method of a semiconductor device including a voltage comparison circuit suitable for setting an internal voltage through a test operation may include inputting a test reference voltage to the voltage comparison circuit, receiving the test reference voltage and performing a calibration operation on the voltage comparison circuit, and performing a setup operation by comparing the test reference voltage and a test-internal voltage input to the voltage comparison circuit.

DETAILED DESCRIPTION

The present disclosure includes embodiments for structural and/or functional descriptions. The scope of rights of the present disclosure should not be construed as being limited to the described embodiments. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of terms described in this application should be understood as follows.

The terms, such as the "first" and the "second," are used to distinguish one dement from another element, and the scope of the present disclosure should not be limited by the terms. For example, a first dement may be named a second dement. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of presented steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as are typically understood by those skilled in the art, unless otherwise defined. Terms defined in commonly used dictionaries should be construed as having the same meanings as those in the context in related technology and should not be construed as having ideal or excessively formal meanings, unless dearly defined in the application.

Figure 1:
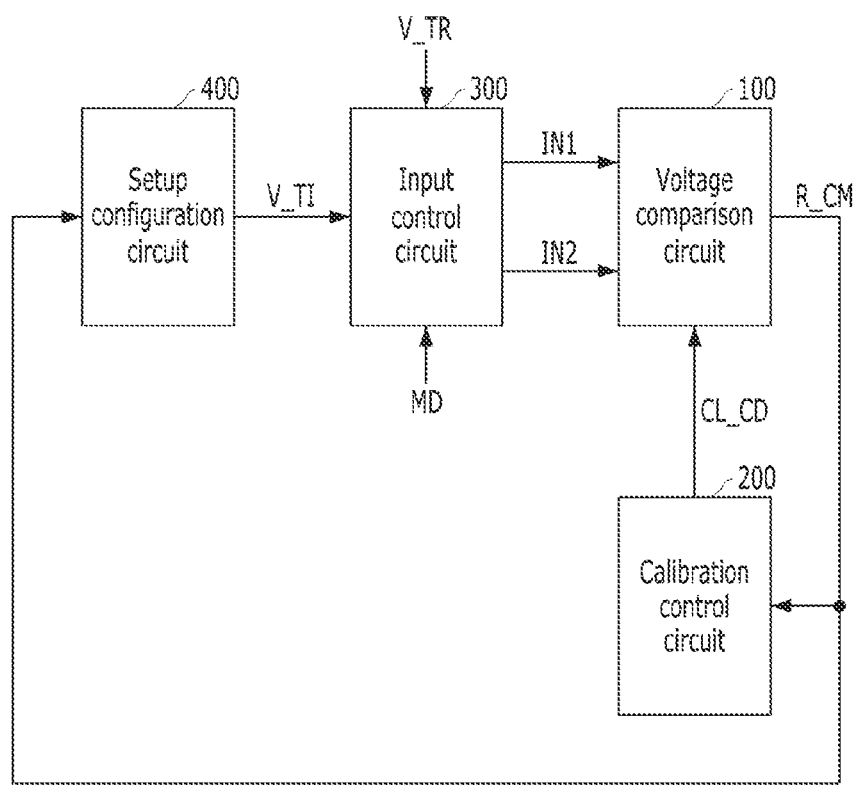
FIG. 1 is a block diagram illustrating a configuration of a semiconductor device according to an embodiment.

FIG. 1 is a block diagram illustrating a configuration of a semiconductor device according to an embodiment.

Referring to FIG. 1, the semiconductor device may include a voltage comparison circuit 100 and a calibration control circuit 200.

First, the voltage comparison circuit 100 may be an dement for generating a comparison result signal R_CM by comparing test reference voltages V_TR received through a first input stage IN1 and a second input stage IN2, respectively. As will be described later, an input control circuit 300 may be provided in front of the first input stage IN1 and second input stage IN2 of the voltage comparison circuit 100. Furthermore, the input control circuit 300 may control the input paths of signals, transmitted to the first input stage IN1 and the second input stage IN2, based on an operation mode signal MD. Accordingly, the voltage comparison circuit 100 may receive the test reference voltages V_TR through the first input stage IN1 and the second input stage IN2, respectively, upon calibration operation.

Figure 2:
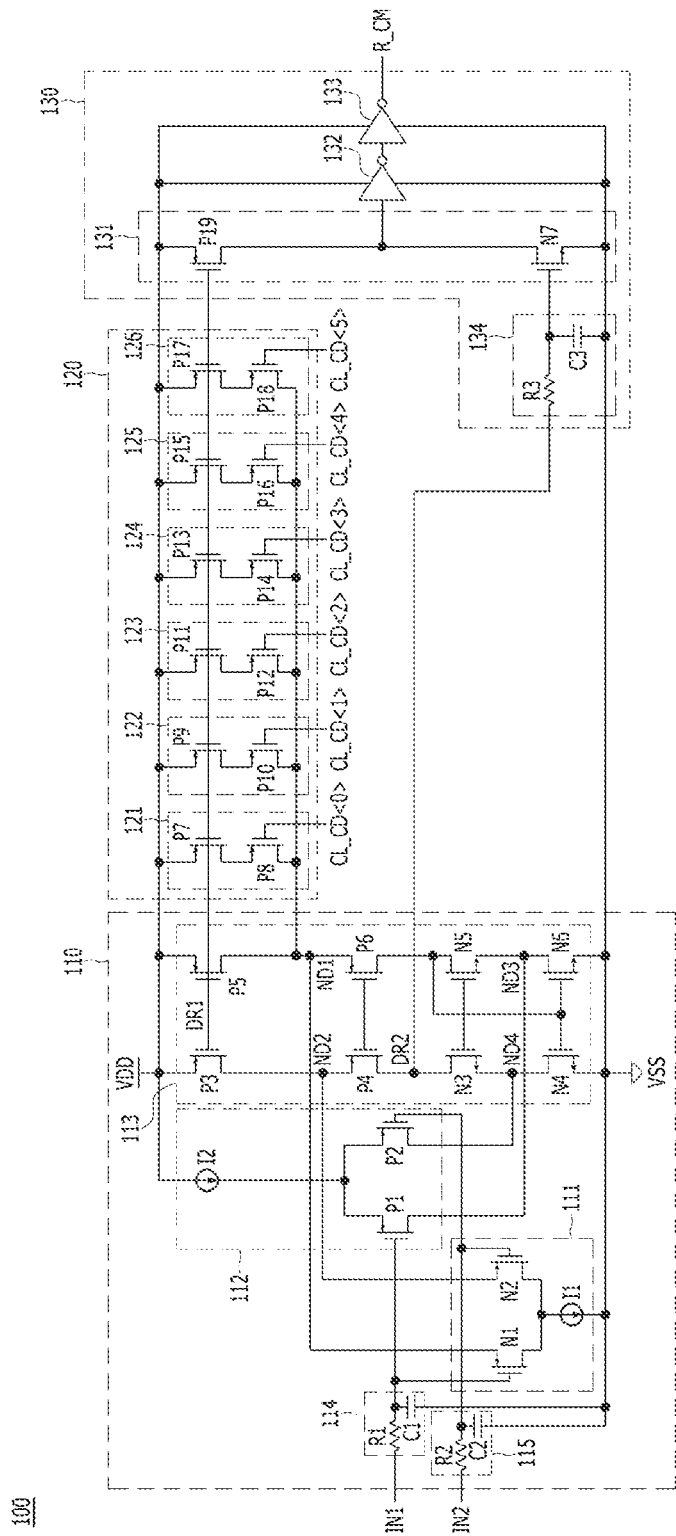
FIG. 2 is a circuit diagrams illustrating a configuration of a voltage comparison circuit of FIG. 1.

FIG. 2 is a circuit diagram illustrating a configuration of the voltage comparison circuit 100 of FIG. 1.

Referring to FIG. 2, the voltage comparison circuit 100 may include an input circuit 110, an adjustment circuit 120, and an output circuit 130.

First, the input circuit 110 may be an element for receiving input signals through the first input stage IN1 and the second input stage IN2. More specifically, the input circuit 110 may include a first differential input circuit 111, a second differential input circuit 112, and a current driving circuit 113.

The first differential input circuit 111 may be an element for differentially receiving the input signals through the first input stage IN1 and the second input stage IN2 and generating a sourcing current. The first differential input circuit 111 may include a first NMOS transistor N1, a second NMOS transistor N2, and a first current source I1. The first NMOS transistor N1 may have a drain and a source coupled between a first node ND1 and the first current source I1, and may have a gate coupled to the output of a first filter circuit 114 to be described later. Furthermore, the second NMOS transistor N2 may have a drain and a source coupled between a second node ND2 and the first current source I1, and may have a gate coupled to the output of a second filter circuit 115 to be described later.

The second differential input circuit 112 may be an element for differentially receiving the input signals through the first input stage IN1 and the second input stage IN2 and generating a sinking current. The second differential input circuit 112 may include a first PMOS transistor P1, a second PMOS transistor P2, and a second current source I2. The first PMOS transistor P1 may have a source and a drain coupled between the second current source I2 and a third node ND3, and may have a gate coupled to the output of the first filter circuit 114. Furthermore, the second PMOS transistor P2 may have a source and a drain coupled between the second current source I2 and a fourth node ND4, and may have a gate coupled to the output of the second filter circuit 115.

The current driving circuit 113 may be an element operating based on a sourcing current generated by the first differential input circuit 111 and a sinking current generated by the second differential input circuit 112. The current driving circuit 113 may include a third PMOS transistor P3, a fourth PMOS transistor P4, a third NMOS transistor N3, and a fourth NMOS transistor N4, which are coupled in series between a supply power voltage stage VDD and a ground power voltage stage VSS. Furthermore, the current driving circuit 113 may include a fifth PMOS transistor P5, a sixth PMOS transistor P6, a fifth NMOS transistor N5, and a sixth NMOS transistor N6, which are coupled in series between the supply power voltage stage VDD and the ground power voltage stage VSS.

The third PMOS transistor P3 and the fifth PMOS transistor P5 may have their gates coupled in common to form a first driving node DN1. Furthermore, the gates of the fourth PMOS transistor P4 and the sixth PMOS transistor P6 may be coupled in common. The second node ND2 may be coupled in common between the third PMOS transistor P3 and the fourth PMOS transistor P4. The first node ND1 may be coupled in common between the fifth PMOS transistor P5 and the sixth PMOS transistor P6. Furthermore, the gates of the third NMOS transistor N3 and the fifth NMOS transistor N5 may be coupled in common. The gates of the fourth NMOS transistor N4 and the sixth NMOS transistor N6 may be coupled to the drain of the fifth NMOS transistor N5 in common. The fourth node ND4 may be coupled in common between the third NMOS transistor N3 and the fourth NMOS transistor N4. The third node ND3 may be coupled in common between the fifth NMOS transistor N5 and the sixth NMOS transistor N6. Furthermore, a second driving node DN2 may be formed between the fourth PMOS transistor P4 and the third NMOS transistor N3. Accordingly, the current driving circuit 113 may generate a sourcing current for the first and second nodes ND1 and ND2 coupled to the first differential input circuit 111, and may generate a sinking current for the third and fourth nodes ND3 and ND4 coupled to the second differential input circuit 112.

The adjustment circuit 120 may be an element for adjusting a driving current of the input circuit 110 based on a calibration code CL_CD. In this case, the calibration code CL_CD may include first to sixth calibration codes CL_CD<0:5>, for example. More specifically, the adjustment circuit 120 may include a plurality of first to sixth loading circuits 121, 122, 123, 124, 125, and 126 enabled based on the first to sixth calibration codes CL_CD<0:5>, respectively, and configured to generate currents corresponding different loading values.

The first loading circuit 121 may include a seventh PMOS transistor P7 and an eighth PMOS transistor P8, which are coupled in series between the supply power voltage stage VDD and the ground power voltage stage VSS. The seventh PMOS transistor P7 may have a gate coupled to the first driving node DN1. A gate of the eighth PMOS transistor P8 may receive the first calibration code CL_CD<0>. Accordingly, the first loading circuit 121 may be enabled based on the first calibration code CL_CD<0>, and may output, to the second node ND2, currents corresponding to loading values of the seventh PMOS transistor P7 and the eighth PMOS transistor P8.

The second to sixth loading circuits 122, 123, 124, 125, and 126 may have the same structure as the first loading circuit 121. Accordingly, the second loading circuit 122 may output, to the second node ND2, currents corresponding to loading values of the ninth PMOS transistor P9 and the tenth PMOS transistor P10 based on the second calibration code CL_CD<1>. Furthermore, the third loading circuit 123 may output, to the second node ND2, currents corresponding to loading values of an eleventh PMOS transistor P11 and a twelfth PMOS transistor P12 based on the third calibration code CL_CD<2>. Likewise, each of the fourth to sixth loading circuits 124, 125, and 126 may output, to the second node ND2, a current corresponding to a loading value of each of corresponding transistors based on each of the fourth to sixth calibration codes CL_CD<3:6>.

The output circuit 130 may be an element for outputting the comparison result signal R_CM by comparing output signals of the input circuit 110 into which a driving current is incorporated. In this case, the driving current means a current incorporated into the input circuit 110 due to currents output by the first to sixth loading circuits 121, 122, 123, 124, 125, and 126. The output circuit 130 may include a first output circuit 131, a second output circuit 132, and a third output circuit 133. The first output circuit 131 may compare signals output by the first and second driving nodes DN1 and DN2 of the input circuit 110. The third output circuit 133 may output the comparison result signal R_CM.

First, the first output circuit 131 may include a nineteenth PMOS transistor P19 and a seventh NMOS transistor N7, which are coupled in series between the supply power voltage stage VDD and the ground power voltage stage VSS. The nineteenth PMOS transistor P19 may have a gate coupled to the first driving node DN1. The seventh NMOS transistor N7 may have a gate coupled to the second driving node DN2. Furthermore, the second output circuit 132 may be an element for receiving the output signal of the first output circuit 131 and outputting the received output signal. Furthermore, the third output circuit 133 may be an element for receiving the output signal of the second output circuit 132 and outputting the received output signal as the comparison result signal R_CM. Each of the second output circuit 132 and the third output circuit 133 may be configured as an inverter for inverting and output an input signal.

The semiconductor device according to an embodiment may include the adjustment circuit 120 within the voltage comparison circuit 100. Furthermore, the adjustment circuit 120 may adjust a driving current based on the first to six calibration codes CL_CD<0:5>. Accordingly, the voltage comparison circuit 100 may control an offset value based on the first to six calibration codes CL_CD<0:5>.

The first input stage IN1 may be coupled to the first filter circuit 114. The first filter circuit 114 may be an element for filtering an input signal transmitted through the first input stage IN1. The first filter circuit 114 may be configured with a first resistor R1 and a first capacitor C1. Furthermore, the second input stage IN2 may be coupled to the second filter circuit 115. The second filter circuit 115 may be an element for filtering an input signal transmitted through the second input stage IN2. The second filter circuit 115 may be configured with a second resistor R2 and a second capacitor C2. Furthermore, a third filter circuit 134 may be coupled to the gate of the seventh NMOS transistor N7, that is, the input stage of the output circuit 130. The third filter circuit 134 may be an element for filtering an input signal transmitted to the gate of the seventh NMOS transistor N7.

Referring back to FIG. 1, the calibration control circuit 200 may be an element for generating the calibration code CL_CD for controlling an offset value of the voltage comparison circuit 100 upon a calibration operation and for providing the generated calibration code CL_CD to the voltage comparison circuit 100. As described above, the offset value of the voltage comparison circuit 100 may be controlled based on the calibration code CL_CD.

The semiconductor device according to an embodiment may receive the test reference voltages V_TR through the first input stage IN1 and the second input stage IN2, respectively, upon the calibration operation. Furthermore, the semiconductor device may control an offset value of the voltage comparison circuit 100 based on the calibration code CL_CD in the state in which the test reference voltages V_TR are input to the first input stage IN1 and second input stage IN2 of the voltage comparison circuit 100.

The semiconductor device according to an embodiment may include the input control circuit 300.

The input control circuit 300 may be an element for controlling the input paths of the test reference voltage V_TR and a test-internal voltage V_TI, that is, signals input to the first input stage IN1 and the second input stage IN2, based on the operation mode signal MD. In this case, the operation mode signal MD may be a signal for distinguishing between a calibration operation and a setup operation performed upon a test operation.

More specifically, the input control circuit 300 may transmit the test reference voltage V_TR to the first input stage IN1 and the second input stage IN2 based on the operation mode signal MD upon the calibration operation. Furthermore, the input control circuit 300 may transmit the test reference voltage V_TR to the first input stage IN1 and the test-internal voltage to the second input stage IN2 based on the operation mode signal MD upon the setup operation.

Figure 3:
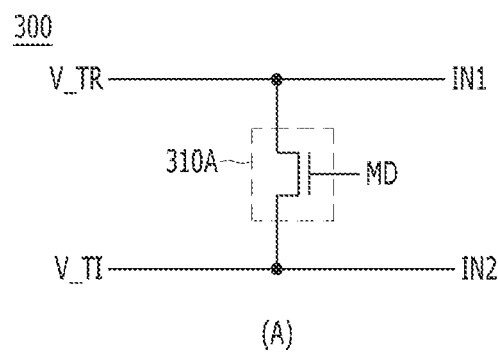
FIG. 3 is a circuit diagram illustrating a configuration of an input control circuit of FIG. 1.
Figure 3:
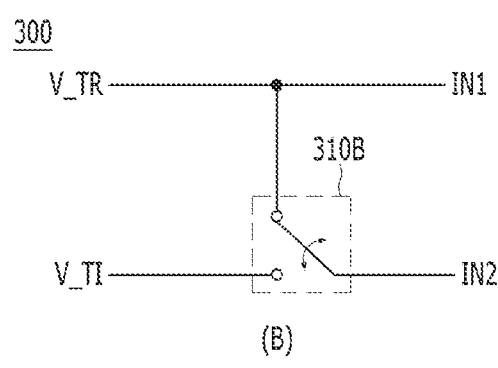

FIG. 3 is a circuit diagram illustrating a configuration of the input control circuit 300 of FIG. 1. FIG. 3 may illustrate an embodiment (A) and embodiment (B) of the input control circuit 300.

Referring to the embodiment (A) of FIG. 3, the input control circuit 300 may include a first switching circuit 310A coupled between the first input stage IN1 and the second input stage IN2. The first switching circuit 310A may perform a turn-on/off operation based on the operation mode signal MD. The switching circuit 310A may be configured as a MOS transistor having a gate to which the operation mode signal MD is input. Accordingly, the first switching circuit 310A may be turned on based on the operation mode signal MD upon calibration operation. Accordingly, the test reference voltage V_TR may be transmitted to the first input stage IN1 and the second input stage IN2. Furthermore, the first switching circuit 310A may be turned off based on the operation mode signal MD upon setup operation. Accordingly, the test reference voltage V_TR may be transmitted to the first input stage IN1, and the test-internal voltage V_TI may be transmitted to the second input stage IN2.

Referring to the embodiment (B) of FIG. 3, the input control circuit 300 may include a second switching circuit 310B coupled to the second input stage IN2. The second switching circuit 310B may receive the test reference voltage V_TR or the test-internal voltage V_TI based on the operation mode signal MD. Accordingly, the second switching circuit 310B may receive the test reference voltage V_TR based on the operation mode signal MD upon calibration operation. Accordingly, the test reference voltage V_TR may be transmitted to the first input stage IN1 and the second input stage IN2. Furthermore, the first switching circuit 310A may receive the test-internal voltage V_TI based on the operation mode signal MD upon setup operation. Accordingly, the test reference voltage V_TR may be transmitted to the first input stage IN1, and the test-internal voltage V_TI may be transmitted to the second input stage IN2.

Referring back to FIG. 1, the semiconductor device according to an embodiment may include a setup configuration circuit 400. The setup configuration circuit 400 may be an element for generating the test-internal voltage V_TI having a voltage level adjusted based on the comparison result signal R_CM upon setup operation.

Figure 4:
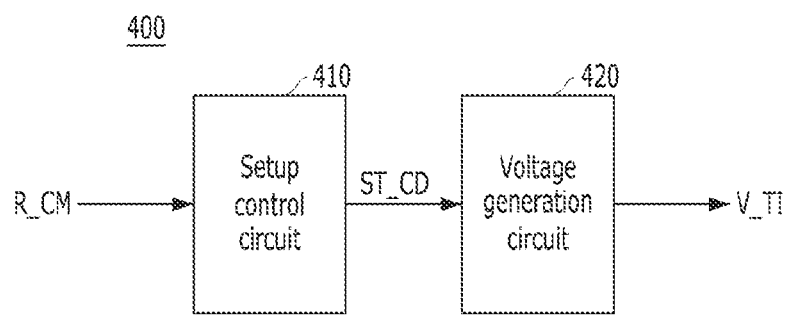
FIG. 4 is a block diagram illustrating a configuration of a setup configuration circuit of FIG. 1.

FIG. 4 is a block diagram illustrating a configuration of the setup configuration circuit 400 of FIG. 1.

Referring to FIG. 4, the setup configuration circuit 400 may include a setup control circuit 410 and a voltage generation circuit 420.

First, the setup control circuit 410 may be an element for generating a setup code ST_CD based on the comparison result signal R_CM. As will be described later with reference to FIG. 5, the setup code ST_CD may include "000", "001" to "111", that is, code signals each having three bits, for example. The voltage generation circuit 420 may be an element for generating the test-internal voltage V_TI having a voltage level corresponding to the setup code ST_CD. The voltage generation circuit 420 may generate the test-internal voltage V_TI having a voltage level to be finally generated through a setup operation. Furthermore, the finally generated test-internal voltage V_TI may directly become an internal voltage of the semiconductor device.

Figure 5:
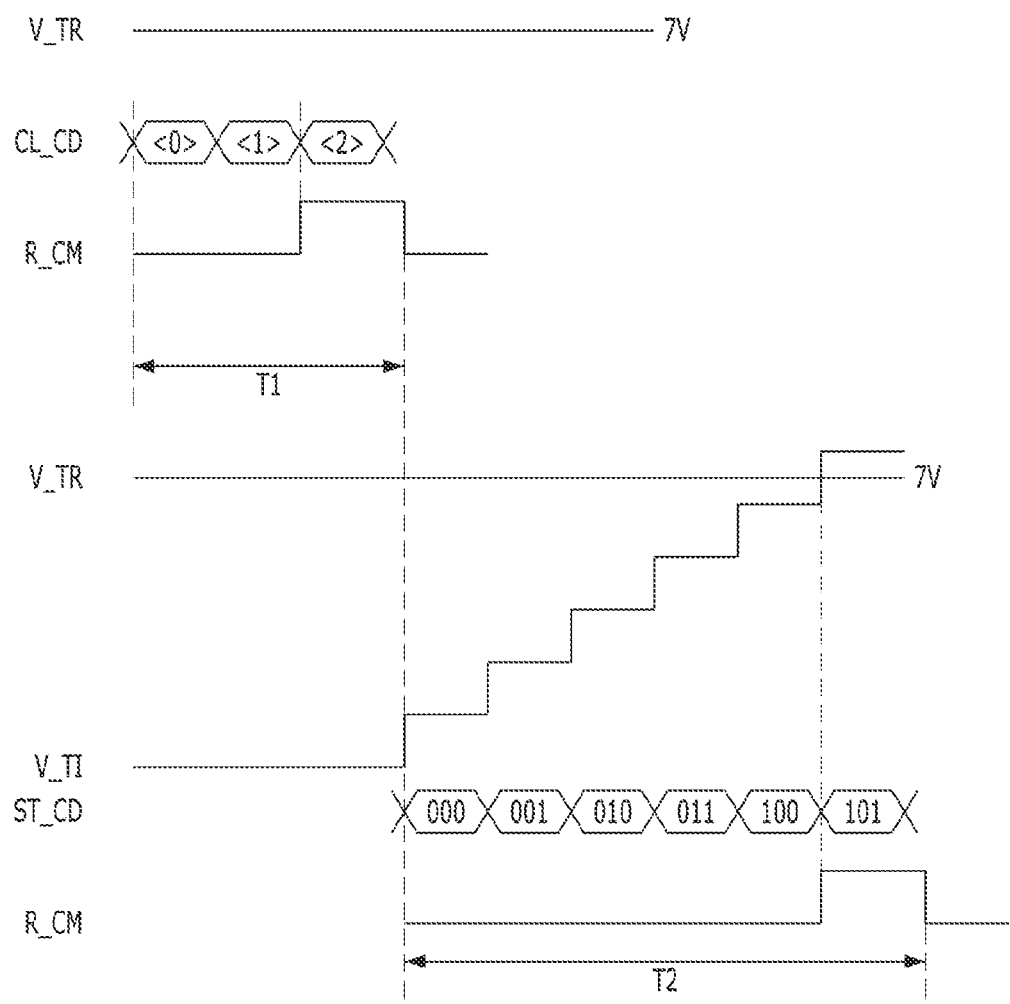
FIG. 5 is a timing diagram illustrating an internal operation of the semiconductor device of FIG. 1.

FIG. 5 is a timing diagram illustrating an internal operation of the semiconductor device of FIG. 1. A process of generating the final internal voltage through a calibration operation and a setup operation is described below with reference to FIGS. 1 to 5.

First, upon the calibration operation, the voltage comparison circuit 100 of FIG. 1 may receive the test reference voltages V_TR, having a voltage level corresponding to that of the final internal voltage, through the first input stage IN1 and the second input stage IN2. In this case, the test reference voltage V_TR may be 7 V, for example. In this case, an offset value of the voltage comparison circuit 100 may be different depending on the input test reference voltage V_TR. That is, although the same test reference voltage V_TR is received through the first input stage IN1 and the second input stage IN2, the voltage comparison circuit 100 may take into account that different voltages are received due to an offset. The semiconductor device according to an embodiment may generate the calibration code CL_CD through the calibration control circuit 200 of FIG. 1, and may control an offset value of the voltage comparison circuit 100.

As may be seen from FIG. 5, the voltage comparison circuit 100 may output the comparison result signal R_CM having a logic "low" when the calibration codes CL_CD <0> and <1> are enabled, and may output the comparison result signal R_CM having a logic "high" when the calibration code CL_CD <2> is enabled. If the comparison result signal R_CM is enabled to a logic "high" this may mean that the test reference voltages V_TR applied to the first input stage IN1 and second input stage IN2 of the voltage comparison circuit 100 have the same voltage level. That is, when the calibration code CL_CD <2> is enabled, the adjustment circuit 120 of FIG. 2 may output driving currents corresponding to a thirteenth PMOS transistor P11 and a fourteenth PMOS transistor P12. At this time, the test reference voltage V_TR input to the first input stage IN1 and second input stage IN2 of the voltage comparison circuit 100 might not be influenced by an offset value of the voltage comparison circuit 100 owing to the driving currents. In this case, a time from timing at which the calibration code CL_CD is enabled to timing at which the comparison result signal R_CM is disabled from the logic "high" to the logic "low" may be defined as a calibration operation section T1.

Upon setup operation, the voltage comparison circuit 100 of FIG. 1 may receive the test reference voltage V_TR through the first input stage IN1, and may receive the test-internal voltage V_TI through the second input stage IN2. The voltage comparison circuit 100 may generate the comparison result signal R_CM by comparing the test reference voltage V_TR and the test-internal voltage V_TI. As described above, the offset value of the voltage comparison circuit 100 for 7 V is stably set through the calibration operation. Accordingly, the voltage comparison circuit 100 can secure a more accurate comparison result for the test reference voltage V_TR and the test-internal voltage V_TI. As the setup code ST_CD changes to "000", "001", . . . "101", a voltage level of the test-internal voltage V_TI may gradually rise. As may be seen from FIG. 5, when the setup code ST_CD becomes "101", the test-internal voltage V_TI may have a higher voltage level than the test reference voltage V_TR. Furthermore, the voltage comparison circuit 100 may enable the comparison result signal R_CM from a logic "low" to a logic "high." When the comparison result signal R_CM is enabled to a logic "high," the setup code ST_CD of "101" may be stored as information for generating the final internal voltage. In this case, a time from timing at which the setup code ST_CD is enabled to timing at which the comparison result signal R_CM is disabled from the logic "high" to the logic "low" may be defined as a setup operation section T2.

The semiconductor device according to an embodiment may control an offset value of the voltage comparison circuit 100 through a calibration operation, and may accurately set the test-internal voltage V_TI through a setup operation.

Figure 6:
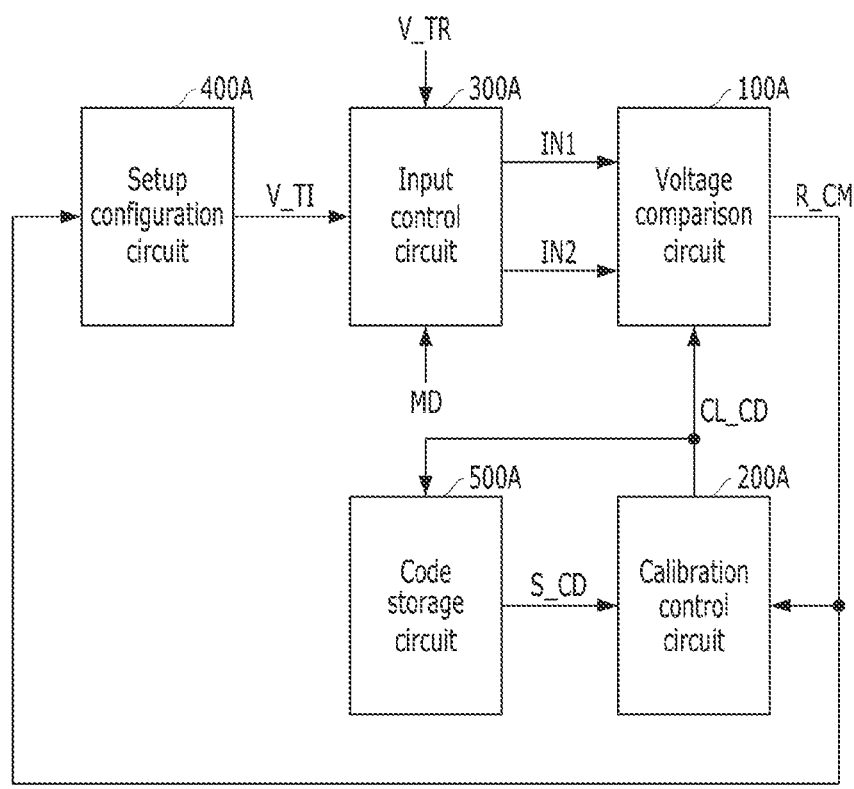
FIG. 6 is a block diagram illustrating a configuration of a semiconductor device according to an embodiment.

FIG. 6 is a block diagram illustrating a configuration of a semiconductor device according to an embodiment.

Referring to FIG. 6, the semiconductor device may include a voltage comparison circuit 100A, a calibration control circuit 200A, an input control circuit 300A, a setup configuration circuit 400A, and a code storage circuit 500A. The semiconductor device of FIG. 6 according to an embodiment may further include the code storage circuit 500A compared to the semiconductor device of FIG. 1 according to an embodiment. The voltage comparison circuit 100A, the calibration control circuit 200A, the input control circuit 300A, and the setup configuration circuit 400A of FIG. 6 correspond to the voltage comparison circuit 100, the calibration control circuit 200, the input control circuit 300, and the setup configuration circuit 400 of FIG. 1, respectively, and thus detailed description on the configurations and operations thereof may be omitted.

In this case, the code storage circuit 500A may be an element for storing the calibration code CL_CD in the state in which a calibration operation is completed. As may be seen from FIG. 5, the calibration code CL_CD in the state in which the calibration operation is completed may be "<2>." Accordingly, the code storage circuit 500A may store the calibration code CL_CD <2>. Furthermore, the code storage circuit 500A may provide the calibration control circuit 200A with a calibration code S_CD stored upon next calibration operation. Accordingly, the calibration control circuit 200A may perform a calibration operation based on the calibration code CL_CD <2>, that is, the calibration code S_CD stored upon next calibration operation. Accordingly, the next calibration operation may further reduce the calibration operation section T1.

Figure 7:
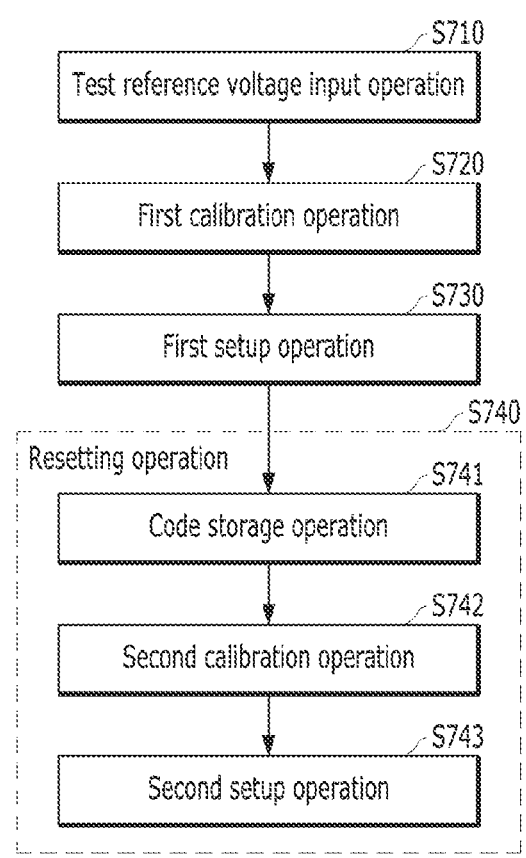
FIG. 7 is a flowchart illustrating an operating method of the semiconductor device of FIGS. 1 and 6 according to an embodiment.

FIG. 7 is a flowchart illustrating an operating method of the semiconductor devices and of FIGS. 1 and 6.

First, referring to FIGS. 1 and 7, an operating method of the semiconductor device may include a test reference voltage input step S710, a first calibration operation step S720, and a first setup operation step S730.

First, the test reference voltage input step S710 may be a step for inputting the test reference voltage V_TR to the first input stage IN1 and second input stage IN2 of the voltage comparison circuit 100. Furthermore, the first calibration operation step S720 may be a step for receiving the test reference voltage V_TR and performing a calibration operation on the voltage comparison circuit 100. Furthermore, the first setup operation step S730 may be a step for comparing the test reference voltage V_TR and the test-internal voltage input to the voltage comparison circuit 100 and performing a setup operation. The test reference voltage input step S710, the first calibration operation step S720, and the first setup operation step S730 have been described with reference to FIGS. 1 to 5, and thus detailed descriptions thereof may be omitted. As already described above, because the setup operation for the test-internal voltage V_TI is completed after the first setup operation step S730, the final internal voltage corresponding to the test-internal voltage V_TI may be generated upon normal operation.

If a semiconductor device is used in the long term, an internal circuit of the semiconductor device may be degraded. If the internal circuit is degraded, a voltage level of an internal voltage may become different from a voltage level set through a setup operation. Accordingly, the semiconductor device according to an embodiment may reset an internal voltage through a calibration operation and a reset operation after a normal operation using the internal voltage set through the first calibration operation step S720 and the first setup operation step S730. An operation of resetting the internal voltage is described with reference to FIGS. 6 and 7.

Referring to FIGS. 6 and 7, the operating method may include a resetting step S740 after the first setup operation step S730. The resetting step S740 may be a step for resetting the test-internal voltage V_TI after the first setup operation step S730 is completed. The resetting step S740 may include a code storage step S741, a second calibration operation step S742, and a second setup operation step S743.

First, the code storage step S741 may be a step for storing, by the code storage circuit 500A, the calibration code CL_CD in the state in which the first calibration operation step S720 is completed in the calibration control circuit 200A. The second calibration operation step S742 may be a step for performing a calibration operation using the stored calibration code S_CD provided by the code storage circuit 500A. As described above, if the calibration operation is performed based on the stored calibration code S_CD, the calibration operation section T1 can be reduced. That is, the calibration operation section T1 of the second calibration operation step S742 may be shorter than the calibration operation section T1 of the first calibration operation step S720.

The second setup operation step S743 may be a step for comparing the test reference voltage V_TR and the test-internal voltage V_TI input to the voltage comparison circuit 100A after the second calibration operation and performing a setup operation. Accordingly, the test-internal voltage V_TI may be reset through the second setup operation step S743.

The semiconductor device according to an embodiment may store the calibration code CL_CD generated through the first calibration operation. Furthermore, the semiconductor device can perform the faster second calibration operation using the stored calibration code S_CD. Accordingly, the semiconductor device can reset an internal voltage more quickly through the second calibration operation and the second setup operation.

An embodiment has an effect in that it can increase the operating speed of a semiconductor device and reduce the area of the semiconductor device by minimizing a configuration and operation for controlling an offset value of the voltage comparison circuit.

An embodiment has an effect in that it can reduce the time taken to set and reset an internal voltage.

Effects of the present disclosure are not limited to the aforementioned effects, and other effects not described above may be evidently understood by those skilled in the art, to which the present disclosure pertains, from the above description.

Although various embodiments have been described for illustrative purposes, it will be apparent to those skilled in the art that various changes and modifications may be made without departing from the spirit and scope of the disclosure as defined in the following claims.

What is claimed is:

1. A semiconductor device comprising:
 a voltage comparison circuit suitable for generating a comparison result signal by comparing test reference voltages received through a first input stage and a second input stage, respectively; and
 a calibration control circuit suitable for generating a calibration code for controlling an offset value of the voltage comparison circuit upon a calibration operation and providing the calibration code to the voltage comparison circuit,
 wherein the voltage comparison circuit comprises:
 an input circuit suitable for receiving input signals through the first input stage and the second input stage;
 an adjustment circuit suitable for adjusting a driving current of the input circuit based on the calibration code; and
 an output circuit suitable for comparing output signals of the input circuit into which the driving current is incorporated and outputting the comparison result signal.

2. The semiconductor device according to claim 1, wherein the input circuit comprises:
 first and second differential input circuits suitable for differentially receiving the input signals and generating a sourcing current and a sinking current, respectively; and
 a current driving circuit suitable for operating based on the sourcing current and the sinking current.

3. The semiconductor device according to claim 1, wherein the adjustment circuit comprises a plurality of loading circuits enabled based on the calibration codes, respectively, and suitable for outputting currents corresponding to different loading values.

4. The semiconductor device according to claim 1, further comprising:
- a first filter circuit coupled to the first input stage and suitable for filtering the input signal; and
- a second filter circuit coupled to the second input stage and suitable for filtering the input signal.

5. The semiconductor device according to claim 1, further comprising a filter circuit coupled to an input stage of the output circuit and suitable for filtering a signal input to the output circuit.

6. The semiconductor device according to claim 1, further comprising an input control circuit suitable for controlling input paths of signals input to the first input stage and the second input stage upon the calibration operation.

7. The semiconductor device according to claim 6, wherein the input control circuit is configured to:
- transmit the test reference voltage to the first and second input stages upon the calibration operation; and
- transmit the test reference voltage to the first input stage and a test-internal voltage to the second input stage upon setup operation.

8. The semiconductor device according to claim 1, further comprising a setup configuration circuit suitable for generating a test-internal voltage having a voltage level adjusted based on the comparison result signal upon setup operation.

9. The semiconductor device according to claim 8, wherein the setup configuration circuit comprises:
- a setup control circuit suitable for generating a setup code based on the comparison result signal; and
- a voltage generation circuit suitable for generating the test-internal voltage having a voltage level corresponding to the setup code.

10. The semiconductor device according to claim 1, further comprising a code storage circuit is configured to:
- store the calibration code when the calibration operation is completed, and
- provide the stored calibration code to the calibration control circuit upon a next calibration operation.

11. An operating method of a semiconductor device comprising a voltage comparison circuit suitable for setting an internal voltage through a test operation, the operating method comprising:
- inputting a test reference voltage to the voltage comparison circuit;
- receiving the test reference voltage and performing a calibration operation on the voltage comparison circuit;
- performing a setup operation by comparing the test reference voltage and a test-internal voltage input to the voltage comparison circuit, and
- resetting the test-internal voltage after the setup operation is completed, wherein resetting the test-internal voltage comprises:
- storing a calibration code when the calibration operation is completed;
- performing a next calibration operation using the stored calibration code; and
- performing a next setup operation by comparing the test reference voltage and test-internal voltage input to the voltage comparison circuit.

* * * * *